United States Patent
Kim et al.

(10) Patent No.: US 9,853,378 B2
(45) Date of Patent: Dec. 26, 2017

(54) SUBSTRATE AND TERMINALS FOR POWER MODULE AND POWER MODULE INCLUDING THE SAME

(71) Applicant: Samsung Electronics Co., Ltd., Suwon-Si, Gyeonggi-Do (KR)

(72) Inventors: Che-Heung Kim, Yongin-si (KR); Chang-Sik Kim, Suwon-si (KR); Seong-woon Booh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/079,007

(22) Filed: Nov. 13, 2013

(65) Prior Publication Data
US 2014/0218871 A1    Aug. 7, 2014

(30) Foreign Application Priority Data
Feb. 7, 2013   (KR) .................. 10-2013-0014124

(51) Int. Cl.
| | |
|---|---|
| *H01R 12/57* | (2011.01) |
| *H05K 7/14* | (2006.01) |
| *H01R 12/70* | (2011.01) |
| *H01L 25/07* | (2006.01) |
| *H02M 7/00* | (2006.01) |

(52) U.S. Cl.
CPC ....... *H01R 12/7088* (2013.01); *H01L 25/072* (2013.01); *H01L 2224/48137* (2013.01); *H01L 2224/48139* (2013.01); *H01L 2224/49111* (2013.01); *H01L 2224/49175* (2013.01); *H01L 2924/1305* (2013.01); *H01L 2924/13055* (2013.01); *H01L 2924/13091* (2013.01); *H02M 7/003* (2013.01)

(58) Field of Classification Search
CPC ... H01R 12/57; H01R 12/7088; H05K 7/1432
USPC .......................... 361/748; 439/626, 627, 884
See application file for complete search history.

(56) References Cited

U.S. PATENT DOCUMENTS

| | | | | |
|---|---|---|---|---|
| 2,260,365 | A | * | 10/1941 | Charmoy ................ 439/601 |
| 5,291,065 | A | * | 3/1994 | Arai ................ H01L 23/5385 257/691 |
| 5,617,293 | A | * | 4/1997 | Schulze ............... H01L 25/112 174/16.3 |

(Continued)

FOREIGN PATENT DOCUMENTS

| | | |
|---|---|---|
| EP | 2317551 A1 | 5/2011 |
| JP | 05335480 A  * | 12/1993 |

(Continued)

*Primary Examiner* — Nathan Milakovich
(74) *Attorney, Agent, or Firm* — Harness, Dickey & Pierce, P.L.C.

(57) ABSTRACT

According to example embodiments, a substrate for a power module includes first to third parts spaced apart from each other, where the third part surrounds the first and second parts, and a conductive layer on the first to third parts. A terminal of a first polarity is connected to the first part, and a terminal of a second polarity is connected to the second part. The first and second terminals may be spaced apart from each other and each have a coupling part, a body, and a contact part. The bodies of the first and second terminals may overlap each other. A power module may include the substrate.

19 Claims, 8 Drawing Sheets

(56) References Cited

U.S. PATENT DOCUMENTS

| | | | |
|---|---|---|---|
| 5,751,058 A * | 5/1998 | Matsuki | H01L 25/072 257/678 |
| 5,761,040 A * | 6/1998 | Iwasa | H01L 23/49811 257/690 |
| 6,024,589 A * | 2/2000 | Hahn, IV | H05K 1/148 174/71 B |
| 6,060,772 A * | 5/2000 | Sugawara | H01L 25/162 257/678 |
| 6,166,464 A * | 12/2000 | Grant | 310/68 R |
| 6,365,965 B1 * | 4/2002 | Jeun | H01L 24/49 257/181 |
| 6,441,317 B1 * | 8/2002 | Tanaka | H01L 25/072 174/255 |
| 6,517,390 B2 * | 2/2003 | Kim | 439/754 |
| 6,629,854 B2 * | 10/2003 | Murakami | H02B 1/20 439/212 |
| 6,885,097 B2 * | 4/2005 | Maeno | H01L 24/49 257/690 |
| 7,046,518 B2 * | 5/2006 | Golightly et al. | 361/736 |
| 7,119,437 B2 * | 10/2006 | Morita | H01L 24/48 257/691 |
| 7,227,259 B2 * | 6/2007 | Heilbronner et al. | 257/724 |
| 7,327,024 B2 | 2/2008 | Stevanovic et al. | |
| 7,449,726 B2 | 11/2008 | Nakanishi et al. | |
| 7,542,317 B2 * | 6/2009 | Azuma et al. | 363/131 |
| 7,705,443 B2 * | 4/2010 | Yokomae | H01L 23/3735 257/666 |
| 7,773,381 B2 * | 8/2010 | Okumura | H01L 25/18 257/691 |
| 8,076,696 B2 | 12/2011 | Beaupre et al. | |
| 8,120,153 B1 * | 2/2012 | Shen | H01L 21/565 257/677 |
| 8,129,836 B2 * | 3/2012 | Takano | H01L 23/49575 257/500 |
| 8,223,506 B2 * | 7/2012 | Lee | 361/775 |
| 8,319,335 B2 * | 11/2012 | Bayerer | H01L 23/04 257/565 |
| 8,461,623 B2 * | 6/2013 | Nakata | H01L 25/072 257/146 |
| 8,466,541 B2 * | 6/2013 | Jones et al. | 257/678 |
| 2001/0026438 A1 * | 10/2001 | Ploix | 361/688 |
| 2002/0018353 A1 * | 2/2002 | Mourick | H01L 24/49 363/131 |
| 2002/0037656 A1 * | 3/2002 | Murakami | H05K 3/368 439/74 |
| 2002/0153532 A1 * | 10/2002 | Sonobe et al. | 257/150 |
| 2003/0173579 A1 * | 9/2003 | Ishii et al. | 257/177 |
| 2007/0051974 A1 * | 3/2007 | Azuma | H01L 24/40 257/177 |
| 2008/0316710 A1 * | 12/2008 | Seto et al. | 361/704 |
| 2010/0173509 A1 * | 7/2010 | Holbrook | B60R 25/00 439/208 |
| 2010/0327654 A1 * | 12/2010 | Azuma et al. | 307/9.1 |
| 2011/0242770 A1 * | 10/2011 | Yamanaka et al. | 361/728 |
| 2013/0015496 A1 * | 1/2013 | Konno | H01L 29/417 257/140 |
| 2013/0069573 A1 * | 3/2013 | Seki | 318/400.27 |
| 2013/0155631 A1 * | 6/2013 | Yamauchi et al. | 361/748 |
| 2013/0201741 A1 * | 8/2013 | Tompkins | H02M 7/003 363/131 |
| 2014/0008781 A1 * | 1/2014 | Nishi et al. | 257/691 |
| 2014/0120774 A1 * | 5/2014 | Kim et al. | 439/626 |
| 2014/0185242 A1 * | 7/2014 | Kim | H01L 23/49861 361/707 |
| 2014/0355221 A1 * | 12/2014 | Sawada et al. | 361/735 |
| 2016/0057881 A1 * | 2/2016 | Tada | H05K 7/1432 361/728 |

FOREIGN PATENT DOCUMENTS

| | | | |
|---|---|---|---|
| JP | 2005347561 A * | 12/2005 | H01L 25/07 |
| JP | 2007012721 A | 1/2007 | |
| JP | 2009219273 A * | 9/2009 | |
| KR | 20080008218 A | 1/2008 | |

\* cited by examiner

SUBSTRATE AND TERMINALS FOR POWER MODULE AND POWER MODULE INCLUDING THE SAME

CROSS-REFERENCE TO RELATED APPLICATIONS

This application claims priority under 35 U.S.C. §119 to Korean Patent Application No. 10-2013-0014124, filed on Feb. 7, 2013, in the Korean Intellectual Property Office, the disclosure of which is incorporated herein in its entirety by reference.

BACKGROUND

1. Field

Example embodiments relate to semiconductor modules, and more particularly, to substrates and/or terminals for power modules and/or power modules including the same.

2. Description of Related Art

A power module is a package-type electrical component that may be configured to perform power conversion such as DC to DC, DC to AC, AC to DC, or AC to AC current using appropriate passive elements and a plurality of switching elements. Examples of power modules are DC-DC converters, AC-AC chargers, DC-AC inverters, etc. These devices may be used for operations such as voltage increase/decrease, charging, power generation/transmission, and motor driving for electronic devices. They may also be used for electric vehicles and renewable energy generation.

SUMMARY

Example embodiments relate to power modules for reducing a voltage overshoot and/or substrates and terminals for the power modules.

Additional aspects will be set forth in part in the description which follows and, in part, will be apparent from the description, or may be learned by practice of example embodiments.

According to example embodiments, a substrate for a power module includes: first to third parts spaced apart from each other, the third part surrounding the first and second parts; a terminal of a first polarity on the first part; a terminal of a second polarity on the second part; and a conductive layer on the first to third parts.

In example embodiments, one of the first and second polarities may be positive, and the other of the first and second polarities may be negative.

In example embodiments, an element module may be on one of the first and second parts.

In example embodiments, an element module may be on the third part.

In example embodiments, the third part may include a control pin installation region and an output terminal installation region.

In example embodiments, the terminal of the first polarity may be on a protruding part of the first part, and the terminal of the second polarity may be on a protruding part of the second part.

In example embodiments, the first and second parts may be parallel with each other without having protruding parts.

According to example embodiments, a terminal for a power module includes: a first terminal configured to have a voltage of a first polarity applied thereto; and a second terminal configured to have a voltage of a second polarity opposite the first polarity applied thereto, wherein the second terminal is adjacent to the first terminal and spaced apart from the first terminal, and at least parts of the first and the second terminals overlap each other.

In example embodiments, the first terminal may include a first coupling part, a first contact part contacting a substrate, and a first body connecting the first coupling part to the first contact part, wherein the first body may define a first through hole.

In example embodiments, the second terminal may include a second coupling part, a second contact part contacting a substrate, and a second body connecting the second coupling part to the second contact part, wherein the second body may define a second through hole.

In example embodiments, the first and second bodies may be parallel with each other.

In example embodiments, at least parts of the first and second through holes may overlap each other.

In example embodiments, the first and second through holes may be formed at different locations in the first body and the second body respectively. An area of the first body may be about equal to an area of the second body.

According to example embodiments, a power module includes: a substrate including first and second parts spaced apart from each other, the first and second parts being conductive; a first terminal on the first part, the first terminal configured to have a first voltage applied thereto; and a second terminal on the second part, the second terminal configured to have a second voltage having a polarity different from the first voltage applied thereto. The first and second terminals are spaced apart from each other and at least parts of the first and second terminals overlap each other.

In example embodiments, the substrate may further include a third part surrounding the first and second parts. The power module may further include a first element module on one of the first and second parts, and a second element module on the third part. The first element module may be connected to the third part, and the second element module may be connected to the first part.

In example embodiments, each of the first and second element modules may include a plurality of insulated gate bipolar transistors (IGBTs).

In example embodiments, the first and second terminals may contact the substrate between the first and second element modules.

In example embodiments, the first and second terminals may have a half-bridge structure and cover the second element module.

In example embodiments, at least parts of the first and second terminals that overlap each other may be on one of the first and second parts of the substrate.

According to example embodiments, a substrate for a power module includes: a first part and a second part surrounded by a third part, the first to third parts being spaced apart from each other; a first terminal of a first polarity electrically connected to the first part; and a second terminal of a second polarity connected to the second part. The second polarity is opposite the first polarity. The second terminal is spaced apart from the first terminal. The second terminal includes a body portion that faces a body portion of the first terminal. The body portions of the first and second terminals each define a hole.

In example embodiments, the first part and the second part may each include protruding portions.

In example embodiments, the first terminal may include a coupling part and a contact part connected to opposite ends of the body of the first terminal, the second terminal may include a coupling part and a contact part connected to opposite ends of the body of the second terminal, the contact part of the first terminal may be connected to the first part, the contact part of the second terminal may be connected to the second part, the bodies of the first and second terminals may overlap each other, and the coupling parts of the first and second terminals may be arranged so they do not overlap each other.

According to example embodiments, a power module may include: the foregoing substrate; a first element module on the second part; and a second element module on the first part. The first element module may be connected to the third part and the second element module may be connected to the first part.

In example embodiments, each of the first and second element modules may include a plurality of insulated gate bipolar transistors (IGBTs), and the first and second terminals may have a half-bridge structure over the second element module.

According to example embodiments, a power module has input terminals installed between modules, wherein at least parts of the input terminals overlap each other. The input terminals have a half-bridge structure that partially covers the modules. Accordingly, counter coupling occurs between the input terminals having different polarities, thereby reducing a mutual inductance. Further, counter coupling may also occur between the input terminals and the modules, and thus, the mutual inductance is further reduced. As a result, an overall effective inductance of the power module decreases, and thus, a voltage overshoot of the power module that occurs when a switch is turned off decreases. Accordingly, a safety margin for the voltage overshoot and element stability during a turning off operation may be improved.

Further, in the case of using the same DC link voltage, an element may be driven at a higher switching rate, and operation reliability may be improved due to an increase in noise immunity.

Moreover, since switching power loss may be reduced by reducing the voltage overshoot, the efficiency of the power module may be improved.

BRIEF DESCRIPTION OF THE DRAWINGS

These and/or other aspects will become apparent and more readily appreciated from the following description of non-limiting embodiments, taken in conjunction with the accompanying drawings in which like reference characters refer to the same parts throughout the different views. The drawings are not necessarily to scale, emphasis instead being placed upon illustrating principles of example embodiments. In the drawings.

DETAILED DESCRIPTION

Figure 1:
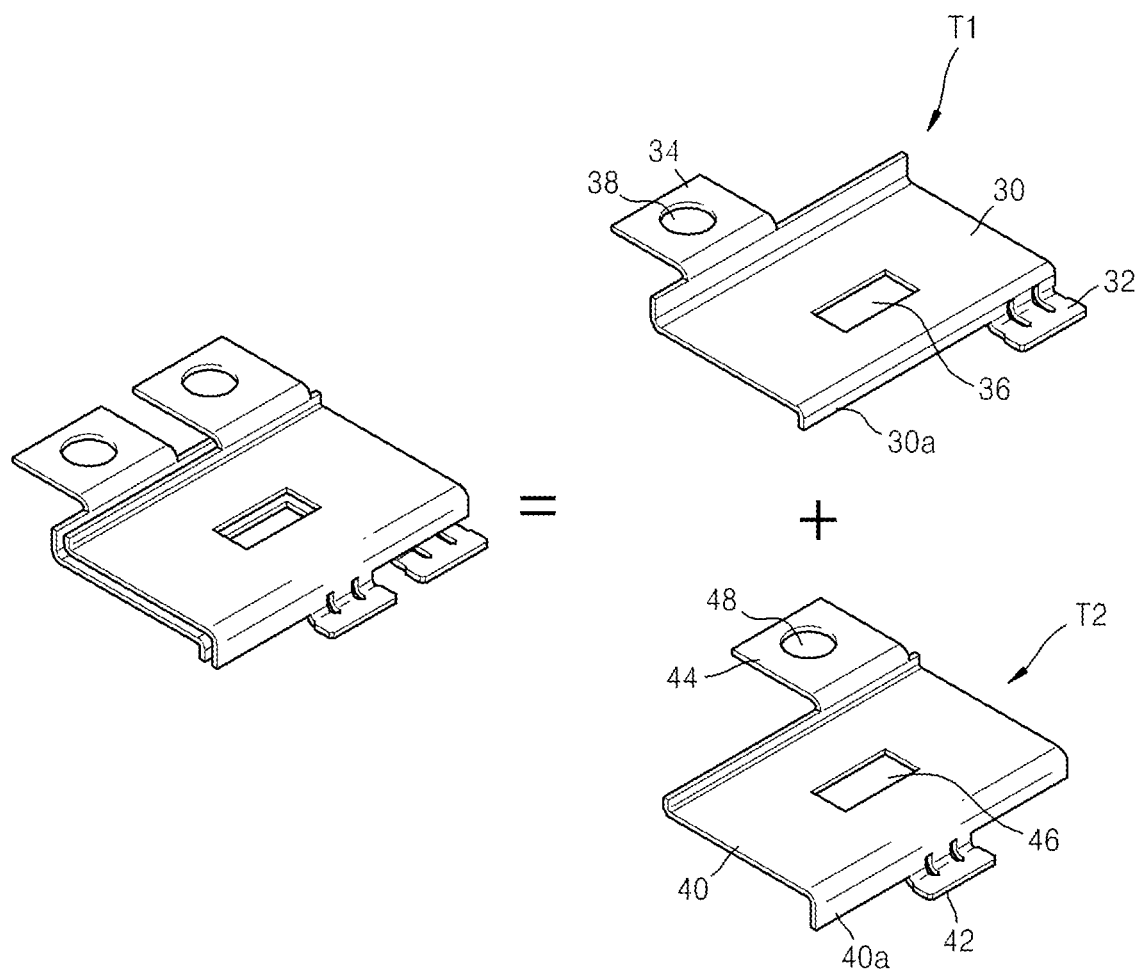
FIG. 1 is a perspective view illustrating a configuration of an input terminal installed in a power module according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a substrate and/or terminals for a power module and/or a power module including the same according to example embodiments will be described in detail with reference to the accompanying drawings. The dimensions of the layers or regions in the drawings may be exaggerated for clarity of illustration.

When a switching element (e.g., a metal oxide semiconductor field effect transistor (MOSFET) or an insulated gate bipolar transistor (IGBT)) in a power module is turned on/off, more particularly, turned off, a voltage overshoot may occur due to a stray inductance occurring on a commutation loop including the element. In this case, if a maximal voltage is greater than a rated blocking voltage, the element may be damaged. To overcome this limitation, an operational reference voltage may be reduced or a switching speed may be reduced. However, both methods result in efficiency degradation of the power module. The voltage overshoot may be corrected by using a snubber including an RC circuit. However, in this case, the cost and volume of the power module may increase.

According to example embodiments, power modules may reduce a voltage overshoot.

FIG. 1 is a perspective view illustrating a configuration of an input terminal installed in a power module according to example embodiments. The input terminal may be a direct current (DC) terminal. Referring to FIG. 1, the input terminal includes a first terminal T1 and a second terminal T2. The first and second terminals T1 and T2 partially overlap each other. One of the first and second terminals T1 and T2 may be a positive terminal and the other may be a negative terminal.

The first terminal T1 includes a body 30, a contact part 32, and a coupling part 34. An area of the body 30 is greater than that of the contact part 32 or the coupling part 34. The contact part 32 is provided on one side of the body 30 and protrudes therefrom. The first terminal T1 is installed at a desired (and/or alternatively predetermined) location of the power module through the contact part 32. The contact part 32 may be integrated with the body 30. The coupling part 34 is connected to the body 30 and protrudes in an opposite direction to the contact part 32. The coupling part 34 has a through hole 38 for bolt coupling. Like the contact part 32, the coupling part 34 may be integrated with the body 30. A through hole 36 may be formed in the body 30. The through hole 36 is for adjusting mutual coupling between the first and second terminals T1 and T2. The through hole 36 may have various shapes.

Like the first terminal T1, the second terminal T2 has a body 40, a contact part 42, and a coupling part 44. An area of the body 40 may be equal to or similar to that of the body 30 of the first terminal T1. The contact part 42 and the coupling part 44 of the second terminal T2 may be only different from the contact part 32 and the coupling part 34 of the first terminal T1 in terms of contact and coupling locations, and thus, may have the same roles. The contact part 42 of the second terminal T2 may be provided so as not to overlap the contact part 32 of the first terminal T1 when the bodies 30 and 40 of the first and second terminals T1 and T2 overlap each other. The coupling part 44 of the second terminal T2 may be provided so as not to overlap the coupling part 34 of the first terminal T1 when the bodies 30 and 40 of the first and second terminals T1 and T2 overlap each other. A through hole 48 for bolt coupling may be formed in the coupling part 44 of the second terminal T2.

The body 40 of the second terminal T2 may be parallel to and opposite the body 30 of the first terminal T1. A through hole 46 may be formed in the body 40 of the second terminal T2. The through hole 46 is for adjusting mutual coupling. A mutual inductance may vary with the sizes and locations of the through holes 36 and 46. As illustrated in FIG. 1, the through hole 46 of the second terminal T2 may be formed at a location that overlaps a location of the through hole 36 of the first terminal T1. Alternatively, the locations of the through holes 36 and 46 of the first and second terminal T1 and T2 may be independent of each other. Therefore, the through hole 46 of the second terminal T2 may be formed at any location of the body 40. At the sides of the first and second terminals T1 and T2 where the contact parts 32 and 42 are provided, parts 30a and 40a bent in a vertical direction toward the bodies 30 and 40 exist. The contact parts 32 and 42 are respectively provided at the ends of the bent parts 30a and 40a.

Figure 2:
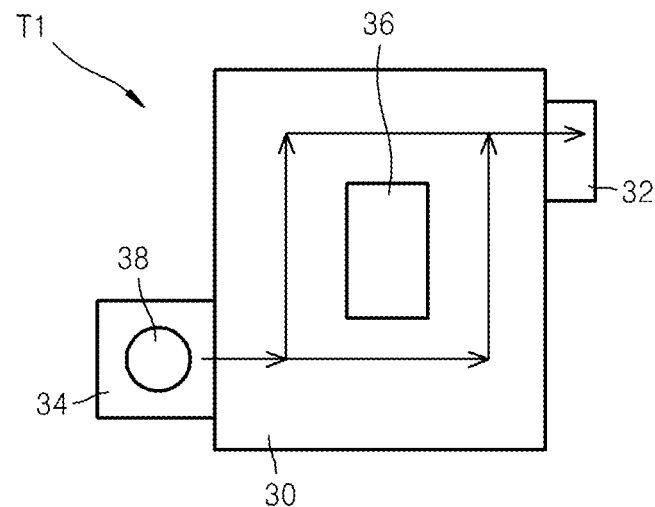
FIG. 2 is a planar view of a first terminal of FIG. 1.

FIG. 2 is a planar view of the first terminal of FIG. 1 for showing a current flow. Referring to FIG. 2, a current (arrow) input to the coupling part 34 is divided in two directions at the front of the through hole 36. One divided current flows to the right side of the through hole 36 and the other divided current flows to the left side of the through hole 36. The two divided currents reunite at the rear of the through hole 36 and then flow as one current to the contact part 32. When the current flows in an opposite direction, e.g., when the current is input to the contact part 32 and flows out through the coupling part 34, the current flow is opposite to that illustrated in FIG. 2.

Figure 3:
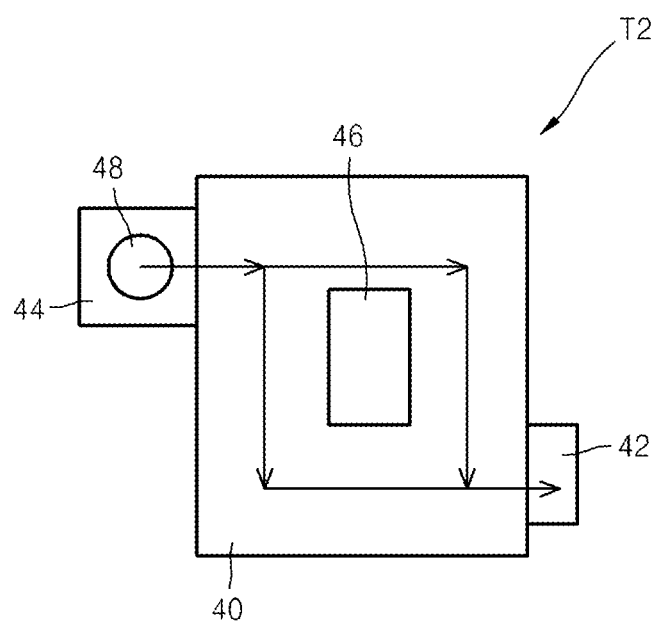
FIG. 3 is a planar view of a second terminal of FIG. 1.

FIG. 3 is a planar view of the second terminal T2 of FIG. 1 for showing a current flow. Referring to FIG. 3, a current (arrow) input to the coupling part 44 is divided in two directions at the front of the through hole 46 formed in the body 40, and then reunite at the rear of the through hole 46 to flow to the contact part 42. When the current is input to the contact part 42 and flows out through the coupling part 44, the current flow is opposite to that illustrated in FIG. 3.

The matrix shown below is an inductance matrix obtained through a boundary element method (BEM) simulation in the case where currents flow through the first and second terminals T1 and T2 as illustrated in FIGS. 2 and 3.

$$\begin{bmatrix} L11 & L12 \\ L21 & L22 \end{bmatrix} = \begin{bmatrix} 11.00 & 3.82 \\ 3.82 & 8.87 \end{bmatrix}$$

An Ansoft Q3D Extractor was used as a BEM simulation tool to obtain self inductance and mutual inductance matrices between the two current loops illustrated in FIGS. 2 and 3. In each current loop, a source and a sink of a reference current are located, and an inductance is calculated by using a magnetic field excited according to current flow. In the simulation, the coupling part 34 or 44 was a current source and the contact part 32 or 42 was a sink.

Lengths of the current loops, a cross section of a current path, and permeability of an adjacent medium are factors that affect the self inductance. The mutual inductance may be affected by a distance between the current paths, relative directions of currents, and an increase/decrease rate of current in each current loop.

In the simulation, a material of terminal models corresponding to the first and second terminals T1 and T2 was copper. However, example embodiments are not limited thereto and other metals may be used instead of copper. A thickness of each terminal model was about 1 mm, and a distance between the terminals was about 1 mm. When the first and second terminals T1 and T2 overlap with each other as illustrated in the left side of FIG. 1, the overall size of the overlapped terminal models (size of the bodies 30 and 40 except for the coupling parts 34 and 44 and the contact parts 32 and 42) was about 45 mm×44 mm×11 mm.

In the above matrix, L11 and L22 represent self inductances of the first and second terminals T1 and T2, and L12 and L21 represent mutual inductances of the first and second terminals T1 and T2. In the above matrix, counter coupling occurs, an effective inductance (self inductance–mutual inductance) for the first terminal T1 is L11–L12=11–3.82=7.18 nH, and an effective inductance for the second terminal T2 is L22–L21=8.87–3.82=5.05 nH. That is, the inductances may be reduced by about 35-43%.

Figure 4:
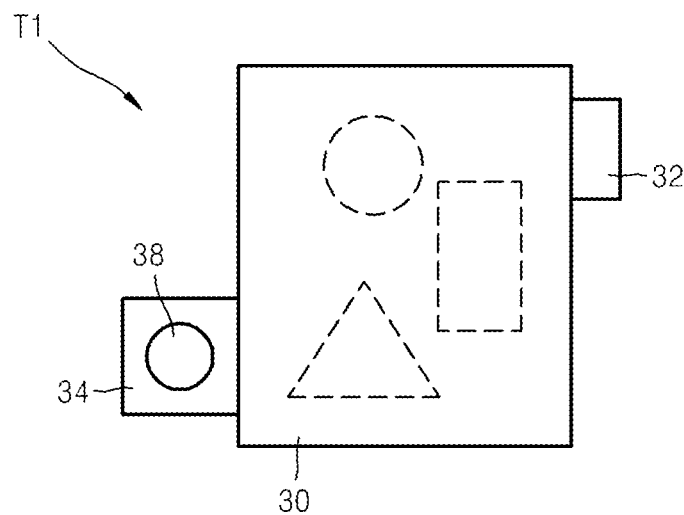
FIG. 4 is a planar view illustrating a case in which the first terminal of FIG. 1 has a different size, location or shape.

The location, size, and shape of the through hole of the first terminal may be different from those illustrated in FIG. 1. FIG. 4 illustrates other examples of the location, size, and shape of the through hole. Referring to FIG. 4, instead of the through hole 36 illustrated in FIG. 1, a through hole (dotted line) having one of the shapes of rectangle, circle, and triangle may be formed in the body 30 of the first terminal T1. Instead of such through holes, a through hole having another shape may be formed. Instead of the through hole 46, the through hole (dotted line) may also be formed in the body 40 of the second terminal T2. A shape of the through hole 36 may be the same as or different than a shape of the through hole 46.

Figure 5:
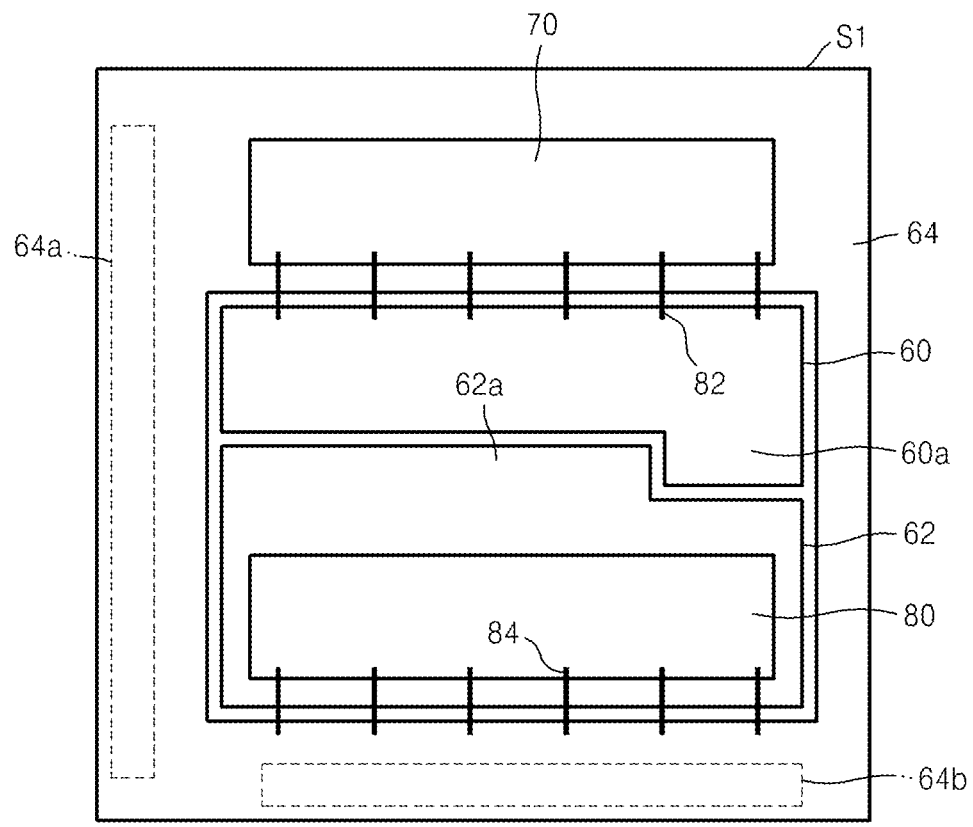
FIG. 5 is a planar view of a substrate for a power module according to example embodiments.

FIG. 5 is a planar view of a substrate for a power module according to example embodiments. The first and second terminals T1 and T2 illustrated in FIG. 1 are installed on the substrate of the FIG. 5. Referring to FIG. 5, a substrate S1 for a power module includes a first part 60, a second part 62, and a third part 64. The first to third parts 60, 62, and 64 are spaced apart from each other and electrically insulated from each other. The first to third parts 60, 62, and 64 are covered with a conductive film. The conductive film, for example, may be a metal such as a copper film. The substrate S1, for example, may be a DBC substrate. The first and second parts 60 and 62 may be adjacent to and opposite each other. The first part 60 has a part 60a protruding toward the second part 62. The contact part 32 of the first terminal T1 is in contact with (installed at) the part 60a of the first part 60. The second part 62 has a part 62a protruding toward the first part 60. The contact part 42 of the second terminal T2 is in contact with (installed at) the part 62a of the second part 62. The parts 60a and 62a may be located at a center of the substrate S1. A stepped part formed by the part 60a of the first part 60 is adjacent to a stepped part formed by the part 62a of the second part 62. An element module 80 is installed on the second part 62. The element module 80 is spaced apart from the part 62a.

The third part 64 surrounds the first and second parts 60 and 62. The third part 64 may completely surround the first and second parts 60 and 62. An element module 70 is installed on the third part 64. The element modules 70 and 80 formed on the substrate S1 may be power elements, for example, a plurality of IGBTs. Each IGBT may include a switching element and a diode. Four IGBTs may be arranged in parallel in each element modules 70 and 80. The element module 70 of the third part 64 is adjacent to the first part 60. The element module 70 is connected to the first part 60 by a wire bonding 82. The element module 80 formed on the second part 62 is connected to a part adjacent to the third part 64 by a wire bonding 84. The third part 64 includes first and second regions 64a and 64b. Control pins (not illustrated) are installed on the first region 64a. Signals for controlling operations of the element modules 70 and 80 may be applied to the element modules 70 and 80 through the control pins. The first region 64a may be located at one side of the substrate S1, and the second region 64b may be perpendicular to the first region 64a. A phase terminal or an output terminal is installed on the second region 64b.

Figure 6:
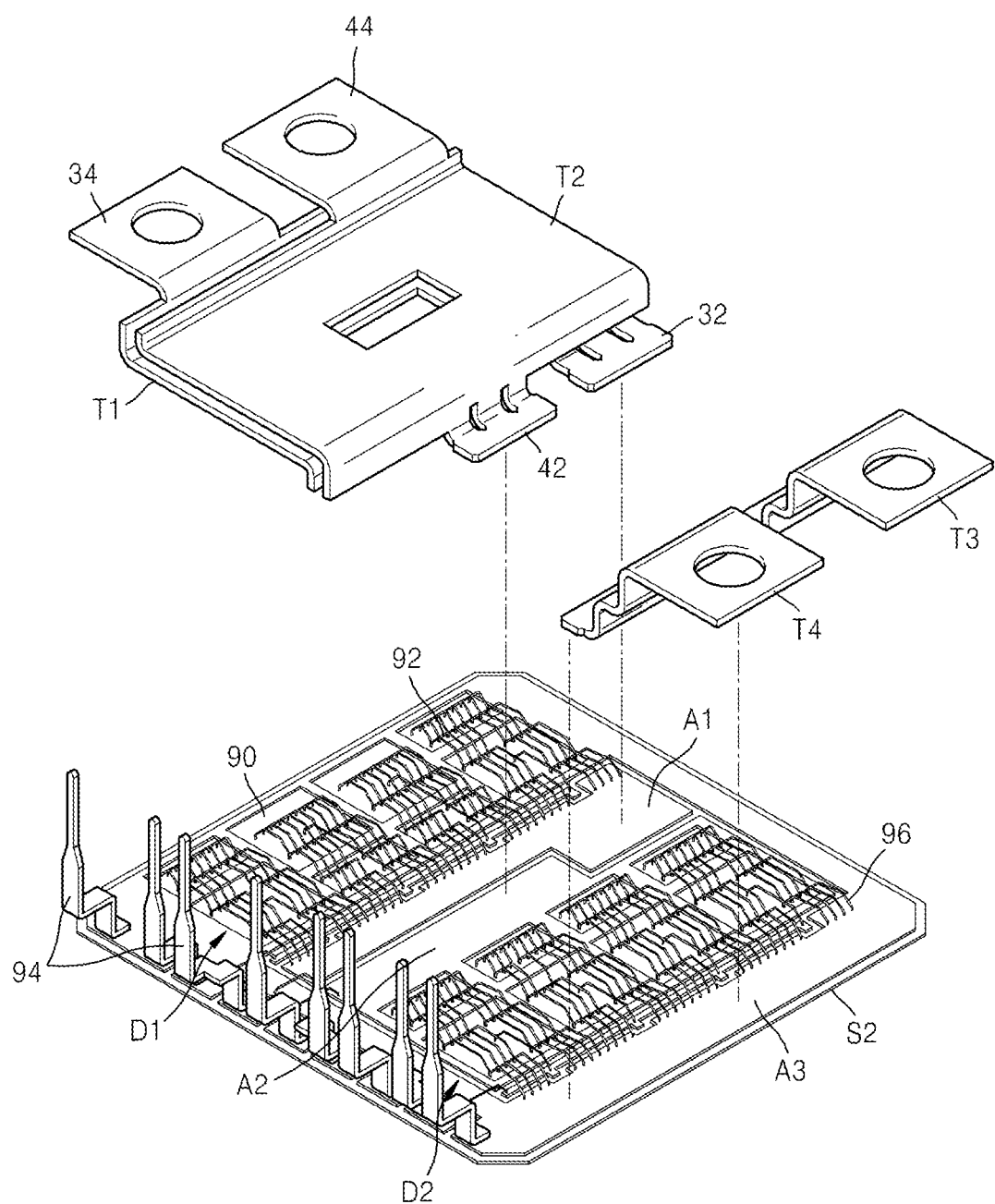
FIG. 6 is a perspective view illustrating examples of a substrate and terminals for a power module according to example embodiments.

FIG. 6 is a perspective view illustrating examples of the substrate for a power module and the terminals. Referring to FIG. 6, first to third parts A1 to A3 of a substrate S2 may correspond to the first to third parts 60, 62, and 64 of the substrate S1 of FIG. 5. The contact part 32 of the first terminal T1 contacts a part of the first part A1 which protrudes toward the second part A2. The contact part 42 of the second terminal T2 contacts a part of the second part A2 which protrudes toward the first part A1. Reference sign D1 may represent a power module including a plurality of element modules, e.g., a plurality of power elements, formed on the third part A3. Reference sign D2 represents a plurality of power modules formed on the second part A2. The element module D1 may correspond to the element module 70 of FIG. 5, and the element module D2 may correspond to the element module 80 of FIG. 5. A plurality of chips 90 included in the element modules D1 and D2 are connected to the first part and a region adjacent to the third part A3 by wire bondings 92 and 96. A plurality of control pins 94 are installed at a location corresponding to the first region 64a of FIG. 5, and are perpendicular to the substrate S2. Third and fourth terminals T3 and T4, which are output terminals, are spaced apart from each other and are installed at a location corresponding to the second region 64b of the third part 64 of FIG. 5. Each of the third and fourth terminals T3 and T4 has a through hole for bolt coupling.

Figure 7:
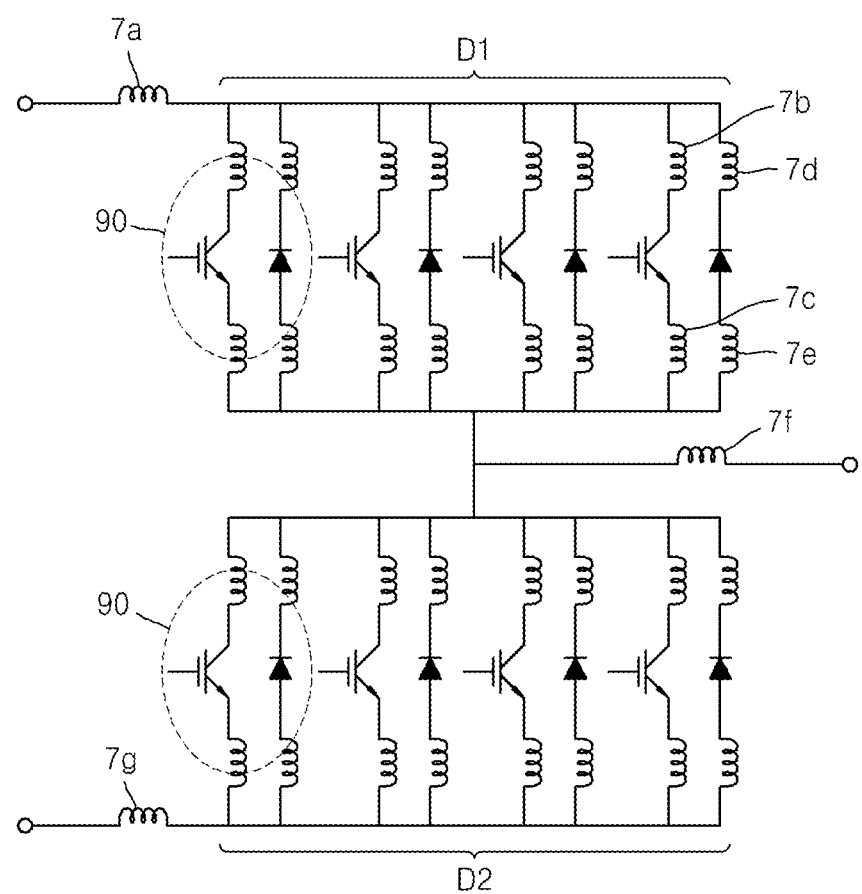
FIG. 7 is a diagram illustrating an equivalent circuit of the device of FIG. 6.

FIG. 7 is a diagram illustrating an equivalent circuit of the device of FIG. 6. Referring to FIG. 7, four chips 90 are connected in parallel in each of the element modules D1 and D2, and an output terminal is connected between the element modules D1 and D2. The chip 90 is an IGBT and includes a transistor and a diode connected in parallel thereto. In FIG. 7, reference signs 7a to 7g represent inductance components. Thus, reference signs 7a and 7g respectively represent inductances of the first and second terminals T1 and T2. Also, reference sign 7f represents an inductance of the output terminal.

Figure 8:
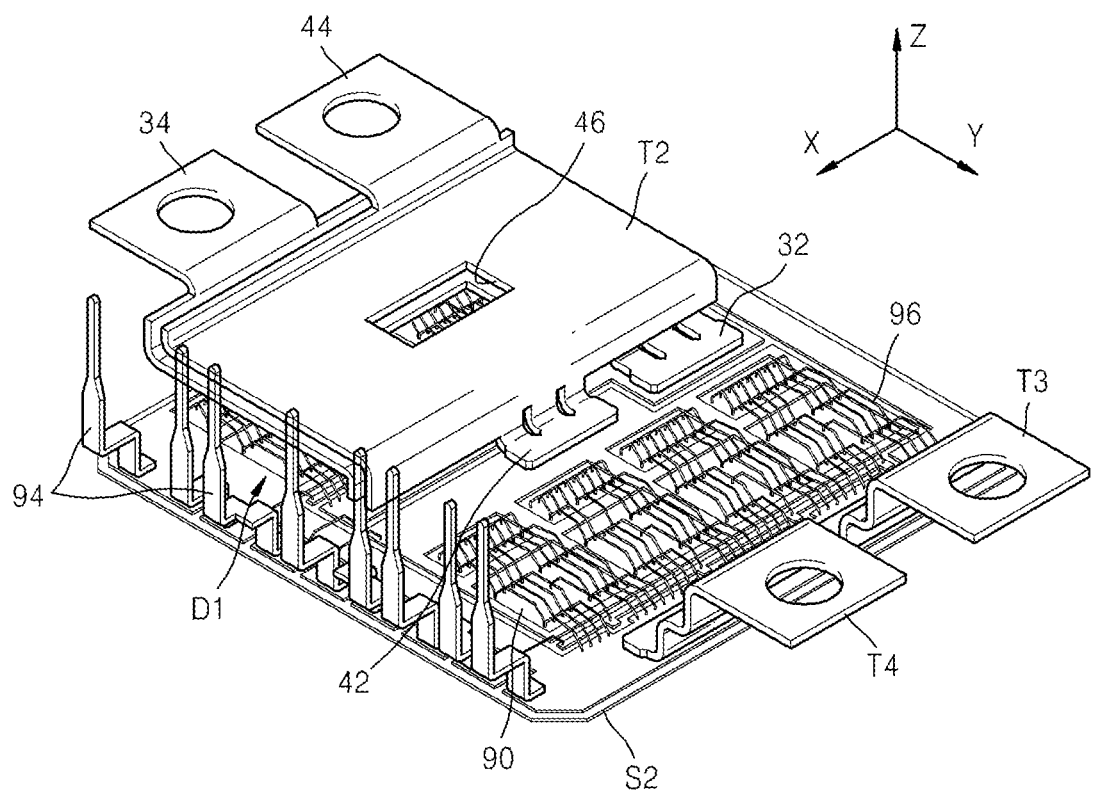
FIG. 8 is a perspective view illustrating a state where the substrate and terminals of FIG. 6 are coupled to each other.

FIG. 8 is a perspective view illustrating a state where the substrates and terminals of FIG. 6 are coupled to each other. Referring to FIG. 8, the body parts of the first and second terminals T1 and T2 are overlapped with each other and are installed in a half-bridge structure. In addition, the first terminal T1 is installed on the substrate S2 so that the body 30 of the first terminal T1 is located on the element module D1. The body 30 of the first terminal T1 does not directly contact the element module D1, but covers the element module D1. The second terminal T2 is located on the first terminal T1. The through holes 36 and 46 of the bodies 30 and 40 of the first and second terminals T1 and T2 are formed at the same location. As described above, the through holes 36 and 46 may be formed so as not to overlap each other or so as to partially overlap each other.

Figure 9:
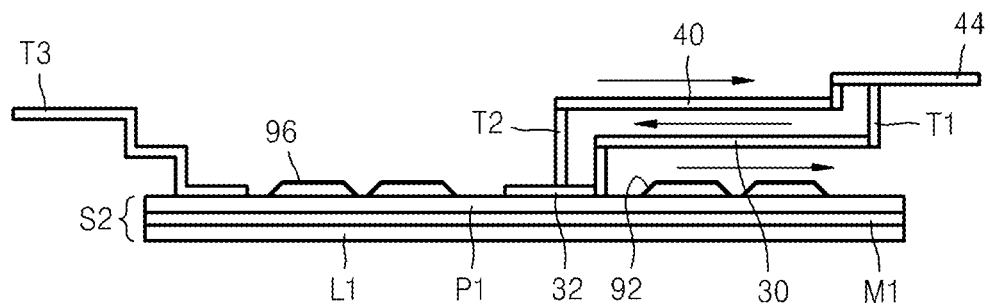
FIG. 9 is a lateral view of X-axis direction of the device of FIG. 8.

FIG. 9 is a lateral view illustrating the left side of the device of FIG. 8. For convenience, FIG. 9 only illustrates the wire bondings 92 and 96 without illustrating the element modules. Referring to FIG. 9, the substrate S2 includes a lower conductive layer L1, an insulating layer M1, and an upper conductive layer P1 which are sequentially layered. The lower and upper conductive layers L1 and P1 may be the same conductive layers. The body 40 of the second terminal T2 is located on the body 30 of the first terminal T1, and the bodies 30 and 40 are spaced apart from each other. The wire bonding 92 exists under the body 30 of the first terminal T1. In FIG. 9, arrows represent directions of currents that flow through the first and second terminals T1 and T2 and the wire bonding 92. A direction of the current flowing through the first terminal T1 is opposite to that of the current flowing through the second terminal T2. The direction of the current flowing through the first terminal T1 is opposite to that of the current flowing through the wire bonding 92. As described above, since the first and second terminals T1 and T2 are installed on the substrate S2 in a half-bridge structure, the first terminal T1 naturally forms counter coupling with the second terminal T2 and the wire bonding 92, thereby additionally reducing a mutual inductance. Accordingly, the total inductance of the power module is further reduced, and thus, the voltage overshoot that occurs when a switch is turned off may be reduced.

Figure 10:
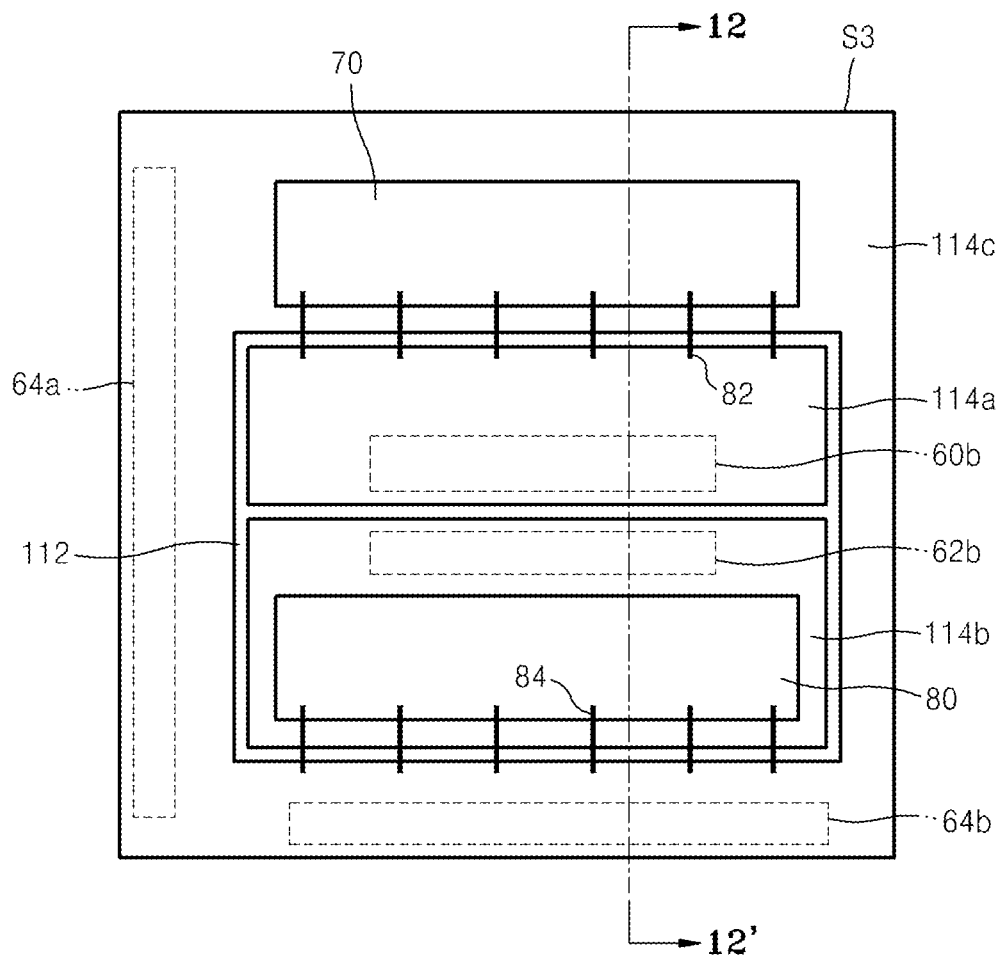
FIG. 10 is a planar view of a substrate for a power module according to example embodiments.

FIG. 10 is a planar view of a substrate for a power module according to example embodiments. Only different parts from those shown in FIG. 5 are described. Referring to FIG. 10, first to third conductive layers 114a to 114c are disposed over a substrate S3. The first and second conductive layers 114a and 114b correspond to the first and second parts 60 and 62 of FIG. 5, but do not have protruding parts unlike the first and second parts 60 and 62. The first and second conductive layers 114a and 114b are parallel with each other, and opposite parts therebetween are also parallel with each other without being bent. A width and breath of the first conductive layer 114a are uniform. A width and breath of the second conductive layer 114b are also uniform. The first and second conductive layers 114a and 114b are completely surrounded by the third conductive layer 114c. The first and second conductive layers 114a and 114b are spaced apart from each other. The first and second conductive layers 114a and 114b are separated from the third conductive layer 114c. An insulating layer 112 is exposed between the first and third conductive layers 114a and 114c. The first conductive layer 114a includes a third region 60b. The second conductive layer 114b includes a fourth region 62b. A first polarity-type terminal may be in contact with (installed at) the third region 60b. A second polarity-type terminal, of which polarity is opposite to the first polarity, may be in contact with (installed at) the fourth region 62b. The third and fourth regions 60b and 62b may be parallel with each other and oppose each other. The third region 60b is spaced apart from a wire bonding 82. The fourth region 62b is spaced apart from an element module 80.

Figure 11:
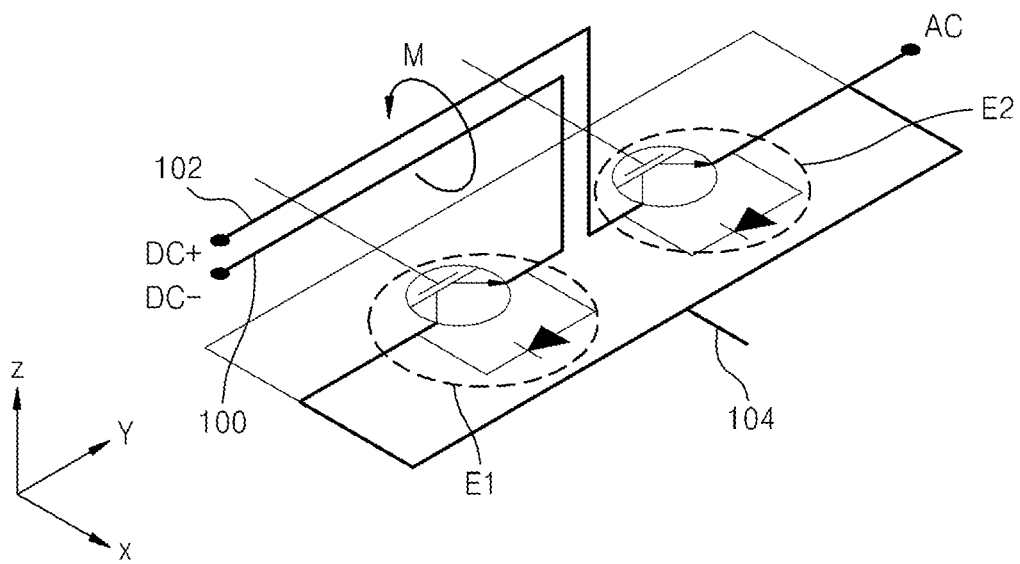
FIG. 11 is a diagram illustrating an equivalent circuit of the devices of FIGS. 5 and 10.

FIG. 11 is a diagram illustrating an equivalent circuit of the devices of FIGS. 5 and 10. Referring to FIG. 11, a first element E1, which is included in the element module 70 of FIGS. 5 and 10, represents a transistor and a diode connected in parallel with each other. A second element E2, which is included in the element module 80 of FIGS. 5 and 10, represents a transistor and a diode connected in parallel with each other. The transistor of each of the first and second elements E1 and E2 may be, for example, an IGBT, but example embodiments are not limited thereto. A first input line 100 represents a first polarity-type terminal in contact with (installed at) the protruding part 60a of FIG. 5 and the third region 60b of FIG. 10. A second input line 102 represents a second polarity-type terminal in contact with (installed at) the protruding part 62a of FIG. 5 and the fourth region 62b of FIG. 10. The first and second input lines 100 and 102 may be parallel with each other.

The first input line 100 is connected to an emitter of the transistor and an input terminal of the diode of the first element E1. The second input line 102 is connected to a collector of the transistor and an output terminal of the diode of the second element E2. A negative terminal of DC voltage (DC−) may be connected to the first input line 100, and a positive terminal of DC voltage (DC+) may be connected to the second input line 102. An output line 104 represents an output terminal in contact with (installed at) the output terminal region 64b of FIGS. 5 and 10. The output line 104 is connected to the other ends of the first and second elements E1 and E2. The output line 104 is connected to a collector of the transistor and an output terminal of the diode of the first element E1 at the other end of the first element E1. The output line 104 is connected to an emitter of the transistor and an input terminal of the diode of the second element E2 and the other end of the second element E2. Currents that flow through the first and second input lines 100 and 102 may be parallel with each other. A direction of the currents that flow through the first and second input lines 100 and 102 is opposite to that of the current that flows through the first element E1. The direct currents inputted through the first and second input lines 100 and 102 are switched and converted to AC signals, and then are outputted to the output line 104. Through an opposite process, a current 100I (hereinafter, a first current) may flow from the output line 104 to the first input line 100 via the transistor of the first element E1, or a current 102I (hereinafter, a second current) may flow from the output line 104 to the second input line 102 via the diode of the second element E2. A magnetic field M around the first and second input lines 100 and 102 represents a magnetic field caused by mutual coupling of the first and second currents 100I and 102I. Even though the directions of the first and second currents 100I and 102I are the same, increase/decrease rates thereof are opposite to each other. Accordingly, a mutual inductance decreases.

Figure 12:
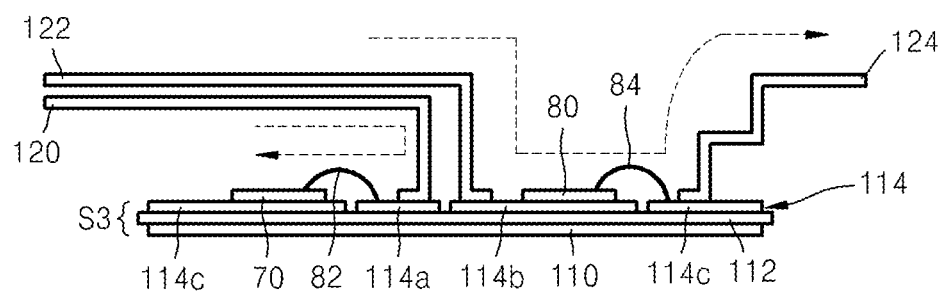
FIG. 12 is a cross sectional view of the device taken along line 12-12' of FIG. 10.

FIG. 12 is a cross sectional view of the device taken along line 12-12' of FIG. 10. The terminals 120, 122, and 124 are not illustrated in FIG. 10 for convenience, but are illustrated in FIG. 12. Referring to FIG. 12, the substrate S3 for an element module includes a lower conductive layer 110, an insulating layer 112, and an upper conductive layer 114 which are sequentially layered. The upper conductive layer 114 includes the first conductive layer 114a to which the first polarity-type terminal 120 is connected (installed), the second conductive layer 114b to which the second polarity-type terminal 122 is connected (installed), and the third conductive layer 114c that surrounds the first and second conductive layers 114a and 114b. The first polarity-type input terminal 120 is installed on the first conductive layer 114a. The first polarity-type input terminal 120 is spaced apart from a wire bonding 82. The element module 70 installed on the third conductive layer 114c is connected to the first conductive layer 114a by the wire bonding 82. The second polarity-type input terminal 122 is installed on the second conductive layer 114b. The second polarity-type input terminal 122 is spaced apart from the element module 80. The element module 80 installed on the second conductive layer 114b is connected to the third conductive layer 114c by the wire bonding 84. The output terminal 124 is installed on the third conductive layer 114c. The output terminal 124 is spaced apart from the wire bonding 84. The input terminals 120 and 122 may include horizontal parts that are parallel with the substrate S3 and vertical parts that are perpendicular to the substrate S3. The horizontal part of the input terminal 122 which is parallel with the substrate S3 is located above the horizontal part of the input terminal 120 which is parallel with the substrate S3.

In FIG. 12, dotted lines represent current directions. A current that flows through the input terminal 122 is transferred to the output terminal via the second conductive layer 114b, the element module 80, the wire bonding 84, and the third conductive layer 114c. A current that flows through the input terminal 120 is transferred to the output terminal via the first conductive layer 114a, the wire bonding 82, the element module 70, and the third conductive layer 114c. In this case, the currents are converted to alternating currents by a switching operation before arriving at the output terminal 124. Therefore, an alternating current is outputted through the output terminal 124. A direction of the current that flows through the horizontal part of the input terminal 120 which is parallel with the substrate S3 is opposite to that of the current that flows from the first conductive layer 114a to the element module 70 via the wire bonding 82. Accordingly, a mutual inductance may be reduced.

It should be understood that example embodiments described herein should be considered in a descriptive sense only and not for purposes of limitation. Descriptions of features or aspects within each substrate, terminal and/or power module according to example embodiments should typically be considered as being available for other similar features or aspects in other substrates, terminals and/or power modules according to example embodiments.

While some example embodiments have been particularly shown and described, it will be understood by one of ordinary skill in the art that variations in form and detail may be made therein without departing from the spirit and scope of the claims.

What is claimed is:

1. A substrate for a power module, comprising:
first to third parts on a same surface of an underlying part of the substrate, wherein the first to third parts are spaced apart from each other, electrically insulated from each other, and not directly contacting each other, wherein the third part surrounds the first and second parts;
an element module on the third part;
a terminal of a first polarity on the first part;
a terminal of a second polarity on the second part; and
a conductive layer on the first to third parts, wherein the terminals directly contact the substrate.

2. The substrate for a power module of claim 1, wherein one of the first and second polarities is positive, and an other of the first and second polarities is negative.

3. The substrate for a power module of claim 1, wherein the terminal of the first polarity is on a protruding part of the first part; and the terminal of the second polarity is on a protruding part of the second part.

4. A terminal for a power module, comprising:
a first terminal configured to have a voltage of a first polarity applied thereto; and
a second terminal configured to have a voltage of a second polarity opposite the first polarity thereto,
the second terminal being adjacent to the first terminal and spaced apart from the first terminal, and
at least parts of the first and second terminals overlap each other, wherein
the first and second terminals directly contact a single substrate,
the first and second terminals are mounted on the single substrate, and
each of the first and second terminals has only one contact part contacting the single substrate.

5. The terminal for a power module of claim 4, wherein the first terminal comprises:
a first coupling part;
a first contact part contacting the single substrate; and
a first body connecting the first coupling part to the first contact part,
wherein the first body defines a first through hole.

6. The terminal for a power module of claim 4, wherein the second terminal comprises:
a coupling part;
a contact part contacting the single substrate; and
a body connecting the coupling part to the contact part,
wherein the body defines a through hole.

7. The terminal for a power module of claim 5, wherein the second terminal comprises:
a second coupling part;
a second contact part contacting the single substrate; and
a second body connecting the second coupling part to the second contact part,
wherein the second body defines a second through hole.

8. The terminal for a power module of claim 7, wherein the first and second bodies are parallel with each other.

9. The terminal for a power module of claim 7, wherein parts of the first and second through holes overlap each other.

10. The terminal for a power module of claim 7, wherein an area of the first body is about equal to an area of the second body, and
the first and second through holes are at different locations in the first body and second body respectively.

11. The terminal for a power module of claim 4, further comprising:
at least one terminal connected to the single substrate and spaced apart from the first and second terminals.

12. A power module comprising:
a single substrate including first and second parts spaced apart from each other, the first and second parts being conductive;

a first terminal on the first part, the first terminal configured to have a first voltage applied thereto; and a second terminal on the second part, the second terminal configured to have a second voltage having a polarity different from a polarity of the first voltage applied thereto, the first and second terminals being spaced apart from each other, and at least parts of the first and second terminals overlap each other, wherein the first and second terminals directly contact the single substrate and each of the first and second terminals has only one contact part contacting the single substrate.

13. The power module of claim 12, wherein the single substrate further includes a third part surrounding the first and second parts, and the power module further comprises:

a first element module on one of the first and second parts; and a second element module on the third part, wherein the first element module is connected to the third part, and the second element module is connected to the first part.

14. The power module of claim 13, wherein each of the first and second element modules comprise a plurality of insulated gate bipolar transistors (IGBTs).

15. The power module of claim 13, wherein the first and second terminals contact the single substrate between the first and second element modules.

16. The power module of claim 13, wherein the first and second terminals have a half-bridge structure and cover the second element module.

17. The power module of claim 12, wherein the parts of the first and second terminals that overlap each other are on one of the first and second parts of the single substrate.

18. The power module of claim 13, further comprising:

at least one terminal on the third part and spaced apart from the first and second terminals.

19. A substrate for a power module, comprising:

first to third parts on a same surface of an underlying part of the substrate, wherein the first to third parts are spaced apart from each other, electrically insulated from each other, and not directly contacting each other, wherein the third part surrounds the first and second parts; and an element module on the third part, wherein the element module includes a plurality of insulated gate bipolar transistors (IGBTs).

* * * * *